United States Patent [19]

Smith

[11] Patent Number: 5,184,021
[45] Date of Patent: Feb. 2, 1993

[54] METHOD AND APPARATUS FOR MEASURING THE DIMENSIONS OF PATTERNED FEATURES ON A LITHOGRAPHIC PHOTOMASK

[75] Inventor: Ian R. Smith, Los Gatos, Calif.

[73] Assignee: SiScan Systems, Inc., Campbell, Calif.

[21] Appl. No.: 719,519

[22] Filed: Jun. 24, 1991

[51] Int. Cl.⁵ .............................................. G01N 21/86
[52] U.S. Cl. ..................................... 250/560; 356/376
[58] Field of Search ............... 250/560, 561, 563, 572; 356/244, 376, 384, 392–394; 359/368, 371

[56] References Cited

U.S. PATENT DOCUMENTS

| | | | |
|---|---|---|---|
| 3,560,093 | 2/1971 | Montone | 356/393 |
| 4,541,715 | 9/1985 | Akiyama et al. | 250/577 |
| 4,707,610 | 11/1987 | Lindow et al. | 356/376 |
| 4,718,767 | 1/1988 | Hazama | 356/394 |
| 4,748,335 | 5/1988 | Lindow et al. | 356/376 |
| 4,806,774 | 2/1989 | Lin et al. | 250/572 |
| 4,814,626 | 3/1989 | Doemens et al. | 250/561 |
| 5,004,321 | 4/1991 | Feldman et al. | 359/368 |
| 5,078,482 | 1/1992 | Feldman et al. | 359/371 |

Primary Examiner—David C. Nelms
Assistant Examiner—S. Allen
Attorney, Agent, or Firm—Robert S. Kelly

[57] ABSTRACT

A system for inspecting and measuring the dimensions of patterned features on lithographic photomasks includes a confocal scanning microscope beneath which is mounted the photomask to be inspected. The photomask is moved to permit the imaging beam from the microscope to record reflectivity information at closely spaced points along a scan line at the metal-substrate interface within the photomask, and the unpatterned side of the mask is positioned facing the microscope so that the imaging beam passes through the transparent substrate material of the mask to the desired measurement plane. An objective lens specially corrected for imaging through transparent materials is used in the optical system, and compensating glass plates may be selectively placed between the objective lens and the photomask when the substrate of the mask is thinner than the thickness of transparent material for which the objective lens was corrected.

18 Claims, 3 Drawing Sheets

Fig_3

METHOD AND APPARATUS FOR MEASURING THE DIMENSIONS OF PATTERNED FEATURES ON A LITHOGRAPHIC PHOTOMASK

BACKGROUND OF THE INVENTION

1. Field of the Invention

The present invention pertains to systems for and methods of measuring and inspecting the patterned features on lithographic photomasks such as the metal patterns which are used in printing the surface patterns on semiconductor chips.

2. Description of the Prior Art

The ever increasing demand for greater information or processing capacity on a smaller area of a silicon wafer has naturally resulted in smaller and smaller circuitry patterns on the chips. This, in turn, has required inspection microscopes of greater and greater resolution so that the dimensions and alignment of the lines on the patterns of the microchips can be accurately checked and controlled. It has recently been felt that further decreases in microchip circuitry size can be achieved by putting greater efforts into the inspection and careful control of the formation of the metallic patterns of the photomasks, which patterns are projected in the conventional optical lithography process onto the silicon wafers. Thus, the inspection and control of the process for forming the patterns of the photomask has recently received a great deal of interest.

In inspecting or measuring the dimensions of patterns on photomasks by conventional optical microscopes there is a problem due to the photoresist or other material which may overlie and hence obscure the etched, partially etched or unetched metal patterns in various photomasks and during various photomask manufacturing processes. The foregoing problem has been exacerbated by the development of iterative etching processes whereby the metal is etched away beneath the photoresist layer in a series of steps with inspection being performed by the microscope between steps in order to improve the quality, i.e., the accuracy of the finished product.

In prior art systems for microscopically inspecting photomasks, transmission microscopes were generally used, i.e., optical systems wherein the light source is directed at the quartz unpatterned face of the mask and the microscope is directed at the opposite, patterned face of the mask to detect the light transmitted through the etched areas. However, if photoresist, anti-reflective material or other material overlies the metal pattern on the mask, the transmitted light is distorted thereby making it quite difficult for the systems to accurately determine the location of the edges of the metal. As the degree of the undercut of the metal beneath the photoresist increases, as in iterative etching processes, the resulting loss of accuracy quite obviously limits the ability of the systems to make the necessary measurements of the small dimensions and hence apply the correct processing to achieve the correct final product.

Other prior art inspection systems using reflected light from the patterned face of the mask, rather than transmitted light through the mask, suffer the same problems. For example, where light is directed from a microscope to a small spot on the face of the photomask and reflected back through the microscope to accurately determine the location of the edges of the metal, the overlying photoresist during the iterative etching processes makes the relevant edges of the patterned features hard to define.

Other types of photomasks are currently being developed which present problems using the conventional microscope inspection technique. For example, current phase-shift lithography may utilize masks with multiple-patterned layers of materials of varying thicknesses or with varying patterned and substrate thicknesses. In conventional inspection techniques, wherein the imaging is done from the patterned side of the mask, accurate measurements are difficult to obtain.

SUMMARY OF THE INVENTION

With the present invention a method of measuring the dimensions of the patterned features on a lithographic photomask is provided which permits accurate inspection of conventional photomasks during iterative etching processes where the photoresist remains on the metal during inspection. The method also permits accurate inspection of non-metal photomasks or multi-layered photomasks as might be used in phase-shift lithography by overcoming the problems inherent in the aforedescribed prior art inspection methods. In the present method, a reflective light optical microscope is used with the microscope being positioned to direct light through the unpatterned face of the mask and receive images reflected back from the patterned features through the unpatterned face of the photomask. Then, in a conventional manner, reflectivity information may be obtained at various points on the patterned layer, or the layer of interest, of the photomask so as to provide the relevant information indicative of the dimensions and alignment of the features in the pattern.

In the systems for performing the aforedescribed method, more or less conventional reflective optical microscope systems may be used, but the microscope should include an optical system which has been optically corrected for imaging through transparent materials. Furthermore, since the thickness of the substrate or unpatterned side of the masks may vary from mask to mask, means can be provided for inserting plates of varying thicknesses of substrate material between the photomask and the microscope to compensate for photomask substrate thicknesses of less than a predetermined maximum thickness.

DESCRIPTION OF THE PREFERRED EMBODIMENT

Figure 1:
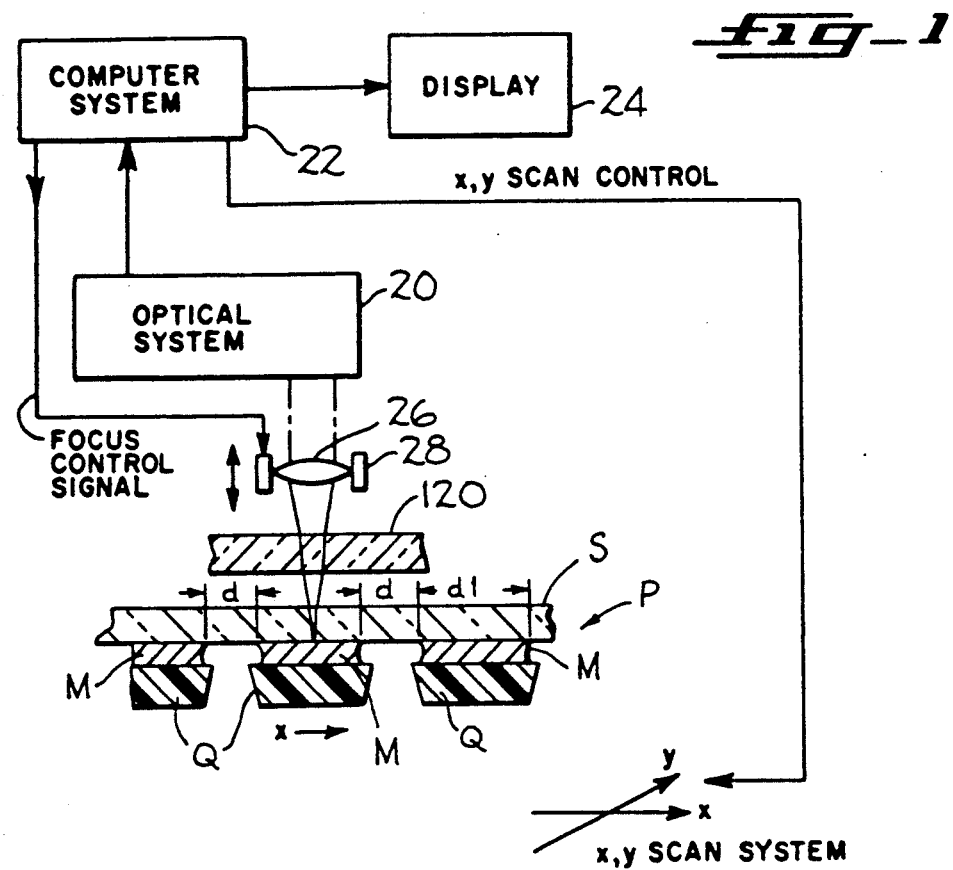
FIG. 1 is a diagrammatic representation of the microscope system of the present invention illustrating a fragment of a photomask as it is inspected by the system.
Figure 2:
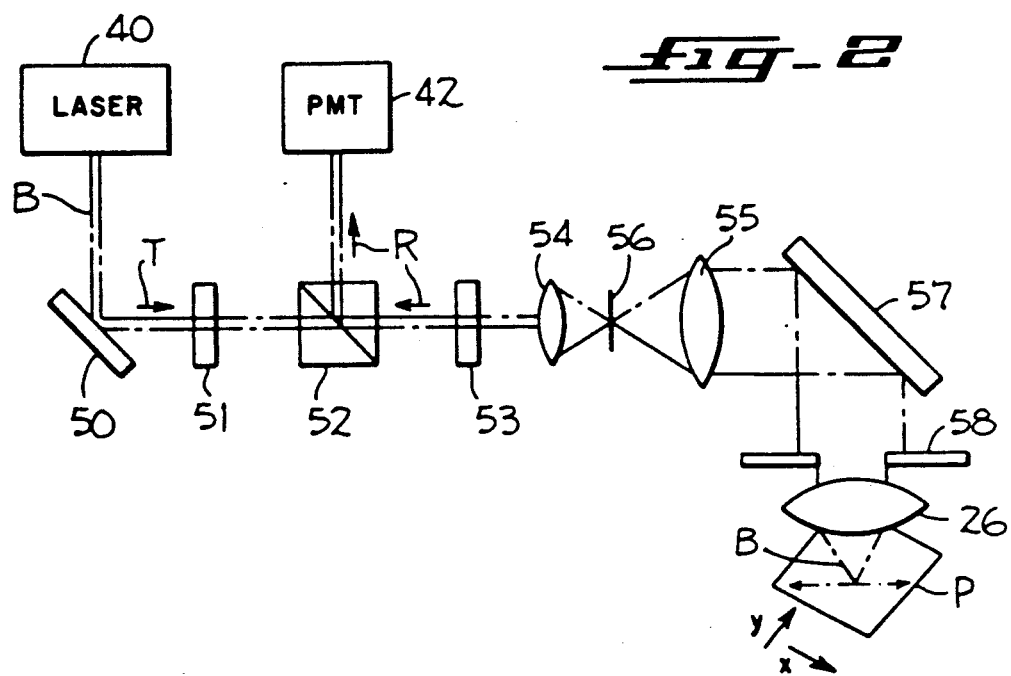
FIG. 2 is a diagrammatic illustration of the optical arrangement of the microscope of FIG. 1.
Figure 3:
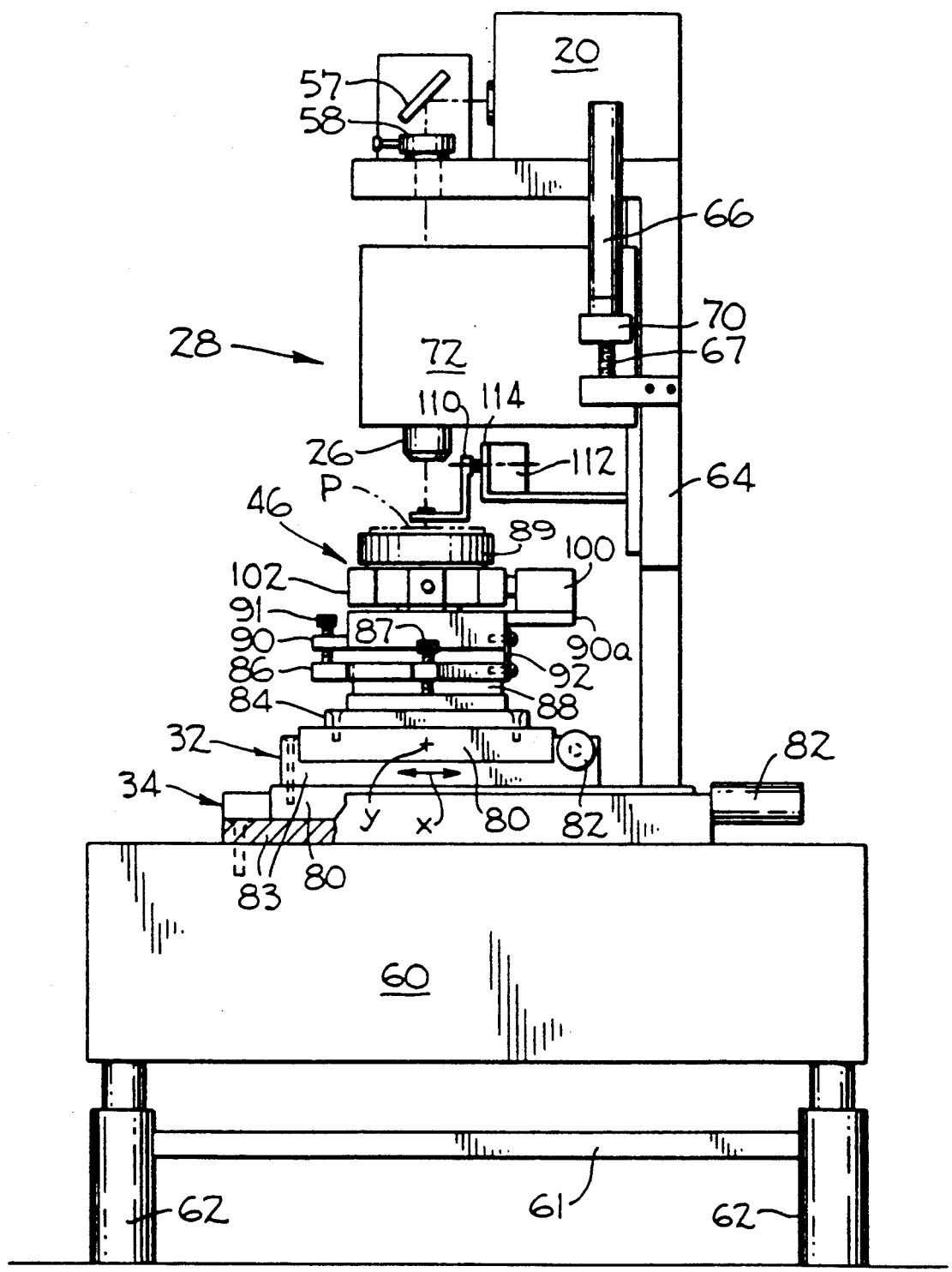
FIG. 3 is a side elevation, partially in section, of the microscope system of the present invention.

The photomask inspection method of the present invention is particularly adapted to be carried out by and to be useful with a microscope scanning and measuring system such as shown in FIGS. 1-3, and more specifically described and claimed in U.S. Pat. Nos. 4,689,491; 4,748,335 and 4,707,610. The disclosures of these prior patents are herein incorporated by reference into the present application and reference to such patents made be had for a more detailed explanation of the apparatus of the present invention and the operation thereof.

Referring now to FIG. 1, which very schematically illustrates the overall system and its method of operation, an optical system 20 is there indicated which is controlled by and provides signals to a computer system 22 which outputs information to various display units 24. The photomask P to be inspected and measured by the system underlies the optical system and is arranged to be moved in a plane lying generally perpendicular to the projected light beam from the optical system 20. Thus, the mask P can be moved over small incremental distances in the x and y orthogonal directions by a mechanical scanning mechanism (not shown in FIG. 1) and in a horizontal plane under the control of signals (x, y scan control) from the computer system 22. Movement in the z direction, i.e., in a direction generally parallel to the light beam projected from the optical system, is accomplished by a focus control mechanism 28 which shifts an objective lens 26 (part of the optical system) over very small vertical distances in order to change the focal plane of the optical system and thereby bring the focused beam spot to the appropriate plane in the mask P. The focus control mechanism is operated from the computer system through a focus control signal to shift the lens 26 up or down as indicated. The beam from the optical system is sharply focused, and it is adapted to be reflected from a surface at or near the focal plane back through the optical system to a photodetector. The signal from the photodetector is digitized by the control circuitry and transmitted to the computer system to represent the intensity of the reflected light from a surface within the photomask P for a plurality of separate, but closely spaced, points in the x-y plane. The relevant information is thereby provided as to the presence or absence of a reflective surface at each of such points. Since the optical system has a very narrow depth of field, reflected intensity peaks at the focal plane and drops off rather sharply as the surface moves away from the focal plane. Thus, only the presence of a reflective surface (metal) at or near the focal plane is detected.

As shown in the greatly magnified mask fragment illustrated in FIG. 1, a conventional photomask P is comprised of a quartz base or substrate S, a chromium metallic layer M with portions thereof being etched away, and an overlying layer of photoresist Q which remains on the metal during iterative etching processes, as explained previously. As can be seen in FIG. 1, the photomask is reversed in position with respect to the optical system from the prior art arrangements; that is to say, the unpatterned side of the substrate S faces the optical system and the patterned face of the mask is directed away from the optical system. The scanning beam is therefore directed through the substrate to focus upon the plane which defines the bottom face (top face with the mask reversed as in FIG. 1) of the metallic layer M. In the arrangement shown, the photomask is adapted to be incrementally shifted in the x direction and readings of the intensity of the reflected beam are taken at closely spaced points along a scan line in such direction to determine the presence or absence of the metal surface and thereby define the widths d1 and spacings d of the various metal segments making up metal layer M. After a complete scan across a line in the x direction, the mask may be shifted slightly in the orthogonal y direction to provide a second set of readings along a parallel x-path. In this manner, the dimensions d1 and alignment of the metal lines in the photomask can be accurately determined over the entire area of the mask being scanned.

The optical system for the apparatus of the present invention is shown schematically in FIG. 2. A laser source 40 provides a closely defined coherent light beam B to a mirror 50 from which the beam is directed through an isolator 51 that allows light to pass only in the direction of the arrow T so as to isolate the laser source from light reflected from the photomask P back through the system. A beam splitter 52 is provided allowing a portion of the transmitted beam B from the laser source to pass directly therethrough while reflecting a portion of the return beam in the direction of the arrows R so that it will be received by a photomultiplier tube 42. An optically birefringent plate 53 is provided to control beam polarization in the optical system. In the present system plate 53 is designed as a one-quarter wavelength plate which can be rotated to control the degree of polarization. Objective lenses 54 and 55 receive both the transmitted beam B and the coincident return beam from the photomask and direct them through a spatial filter 56 which has a small pinhole at the focal point of the two lenses. This pinhole must be smaller than the airy disk of the returning beam; it is typically in the micron, or even submicron, diameter range. The objective lens 55 recollimates the transmitted beam so that only substantially parallel rays of light emanate therefrom, such beam having a diameter of about 1 centimeter. This beam is reflected by a mirror 57 to change its direction to the vertical, and a controlled aperture device 58 is provided to stop down this beam to the desired size. This diameter will be determined by the amount of area desired to be covered by the focus spot in the photomask with smaller spots obviously being required as the line size of the patterns in the photomask is reduced. Finally, the objective lens 26, which is movable vertically through the focus control mechanism 28, focusses the transmitted beam B within the mask in a very small spot (typically about 0.3 to about 1 micron in diameter). Scanning is then accomplished, as previously explained, by moving the mask in the x-y plane so that the laser beam successively scans along a series of closely spaced parallel lines over a small portion (the scanning area) of the mask.

The optical system as illustrated and described comprises a confocal imaging system, i.e., a system wherein there are single or multiple point sources and associated single or multiple point detectors coincident at the focal plane within the photomask. As disclosed, the pinhole plate 56 provides both the point source and the point detector, and the beam of light B and reflected beam both are thus directed through an identical optical system. As shown in FIG. 2, the reflected or returned light beam will pass back through the objective lenses 26, 55 and 54 and through plate 53. The beam splitter 52 causes a portion of the beam to be directed at right angles (in the direction of arrows R) to the photomultiplier tube 42. The portion of the return light that passes through the beam splitter 52 will be blocked by the isolator 51 so that it will not interfere with the beam generated by the laser source 40 so as to create false signal information. The mechanical structure which comprises the photomask scanning apparatus of the present invention is shown in FIG. 3. It will be seen that the entire photomask drive apparatus and the optical system 20 are arranged to be mounted upon a granite surface plate 60 which is seated upon a table 61 and isolated therefrom by four piston and cylinder type air springs 62 mounted to support each corner of the surface plate (two only being shown in FIG. 3). A frame structure 64 is elevated above the surface plate 60 to provide support for the optical system module 20 and the focus control mechanism 28. The focus control mechanism, the details of which are not shown, includes an electromagnetic drive means for elevating or lowering the objective lens 26 by very small amounts (in the submicron range) so as to change the focal length of the optical system and adjust the projected spot within the photomask P. The entire focus control mechanism is mounted within a cage 72 which is adapted to be slid vertically by means of a slidable mount attached to the upright frame 64. A support bracket 70 is attached to one side of cage 72 projecting outwardly therefrom to support a DC servo motor 66 with the projecting lead screw 67 thereof being adapted to engage the upper face of a support secured to the main upright frame 64. It will be seen that movement of the screw 67 within the motor assembly 66 serves to raise or lower the objective lens 26 relative to the underlying mask support assembly. This lens movement is provided only for gross alignment of the optical system relative to the photomask, i.e., to move the optical system into and out of the basic focal range of the optics. Use of the motor 66 to elevate the lens 26 well above the underlying photomask also permits the photomask to be readily loaded and unloaded.

The planar drive arrangement which supports the photomask P in a horizontal plane directly beneath the vertically projected beam from the optical system 20 includes a pair of x and y drive devices or stages 34, 32 mounted one above the other and at right angles to each other as shown. Each stage 34, 32 is comprised of a conventional precision translation table which, in the presently described embodiment of the invention, is designed to have about six to eight inches of linear travel. These tables each include a drive motor 82 which serves to drive a slide block 80 within a channel shaped frame structure 83 by means of a lead screw (not shown) that is threaded to a nut attached to the slide block 80. Although not shown, it will be appreciated that each translation table includes an optical position encoder therein with submicron resolution and accuracy which serves to feed continuous position signals back to the computer 22 so that the precise position of the mask P in the x-y plane at any given time can be controlled and correlated with the reflected intensity measurements from the optical system during the operation of the apparatus. A flat lower tilt plate 84 is firmly attached to the upper face of slide block 80 of the upper, or y-stage, translation table 32, and a middle tilt plate 86 is secured thereto by means of leaf spring 88 which is rigidly bolted to the adjacent spaced ends of both of the tilt plates. Tilt adjusting screw 87 is threaded through the end of tilt plate 86 opposite to the mounting of spring 88 so as to bear against the upper surface of lower tilt plate 84 so that the middle tilt plate (and the structure supported thereabove) can be tilted about the X-axis by adjustment of the screw 87. In a similar manner, an upper tilt plate 90 is secured in spaced relationship to the middle tilt plate 86 by means of a leaf spring 92 bolted to the rearward edges of the tilt plate, and a tilt adjusting screw 91 is threaded through the forward edge of tilt plate 90 to bear against the upper surface of tilt plate 86 so as to adjustably rotate the tilt plate 90 about the Y-axis. It will be understood that in setting up the apparatus initially and checking it thereafter, it is essential that the tilt screws 87 and 91 are properly adjusted to ensure that the surface of upper tilt block 90 lies in a perfectly horizontal plane precisely perpendicular to the path of the light beam from the overhead optical system 20.

The vibratory scanner mechanism 46, by which the photomask P is rapidly vibrated in the direction of the x-axis, includes an electromagnetic driver 100 secured to the upper face of tilt block 90 and having an armature secured to a spring-mounted and elevated vibratory driving mechanism 102 positioned above the tilt block 90 and adapted to be vibrated in the x direction and parallel to tilt block 90 (i.e., horizontally), as shown by the arrow in FIG. 3. A vacuum chuck 89 is supported by the movable portion of the vibratory driving mechanism 102 to support and maintain the photomask in a fixed position beneath the scanning beam from the optical system. Thus, application of an alternating current to the driver 100 shifts the drive mechanism 102 backwardly and forwardly in the direction of arrow x at the frequency of the alternating current applied and over a distance which comprises the scan width of the system, such scan width typically being set for an excursion of about 2 millimeters. During a normal scanning sequence, with the driving mechanism 102 vibrating in the x direction, the y-axis stage 32 is moved slowly in the y direction so that the aforedescribed series of parallel scans in the x direction are provided along the metal-substrate plane of the mask thereby monitoring the dimensions of the lines in the metal layer.

Also shown in FIG. 3 is a substrate thickness compensator mechanism 110 which is mounted for pivotal movement about the drive axis of a stepper motor 112 as shown and which serves to selectively place a glass plate between the photomask P and the overlying optical system to compensate for a particular thickness of substrate of the photomask undergoing inspection which may be different from the substrate thickness for which the optical system is set in a manner to be described in greater detail hereinafter. The stepper motor is mounted upon a bracket 114 attached to the main upright frame 64 of the apparatus.

For a further description of the apparatus and particularly the control system therefor, reference is made to the aforementioned prior U.S. Pat. Nos. 4,689,491; 4,478,335 and 4,707,610.

Figure 4:
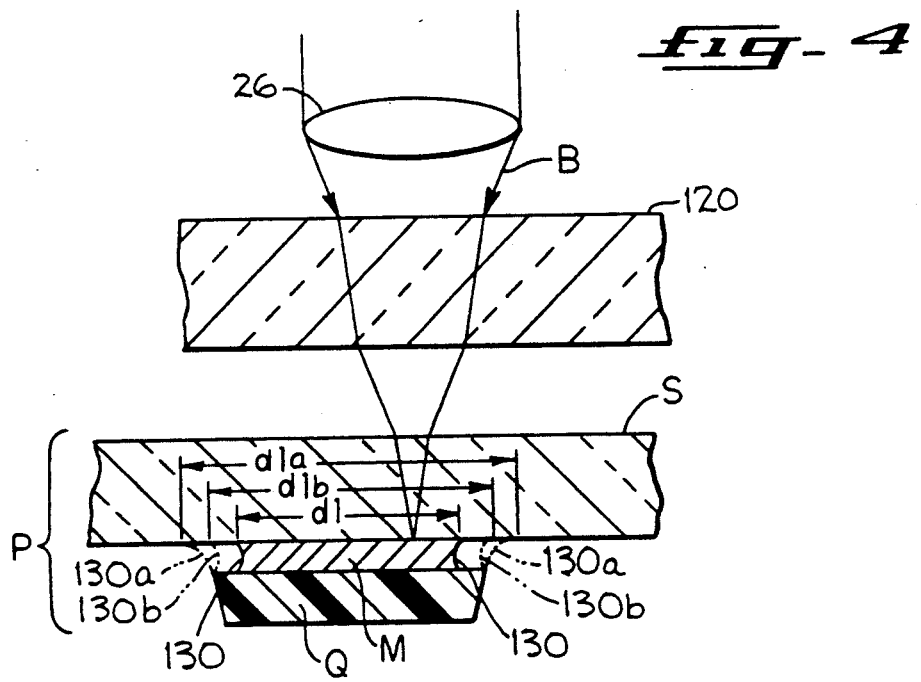
FIG. 4 is a diagrammatic illustration of the manner in which light is directed into and reflected by the photomask when utilizing the microscope of the present invention.

FIG. 4 illustrates the manner in which the system of the present invention operates to scan a photomask undergoing an iterative etching process. The beam B from the objective lens 26 of the optical system is arranged to be focused on the plane defining the substrate-metal (S-M) interface. In the present invention an objective lens is used which is specially corrected for diffraction limited operation through the thickness of photomask substrate being examined. Lenses of this type are conventionally used for examining biospecimens inside plastic incubation vessels. As can be seen, the rays of light from the lens are focused at one angle while moving through air and at a different, less sharp, angle when moving through the quartz substrate due to the differing refractive indices. The corrected lens 26 is chosen to accommodate a maximum thickness of substrate S. Then, for substrates of lesser thickness in the particular photomask undergoing inspection, a compensator disc, or optical plate, 120 is arranged to be placed between the mask and the lens 26 so that the combined optical thickness of substrate and compensator disc generally equals the actual glass thickness for which the corrected lens 26 is set. In the present invention it has been found that a 488 nm wavelength laser can be used as the light source, and a 0.55 N.A. lens corrected for a maximum thickness of substrate of 0.25 inches can be used as objective lens 26. An Olympus ULWD CD Plan 40 lens was found to be adequate but it had to be modified for measuring through the relatively thick glass found in conventional photomask substrates.

By focusing the beam on the S-M interface, and monitoring the reflectivity at closely spaced points along a scan line across the photomask, the width d1 of a metal line or segment M can be accurately determined. This is particularly important when the inspection occurs during an iterative etching process. As shown in FIG. 4, the initial application of acid to the photomask may result in relatively wide edges 130a defining the metal segments. Measurements of segment widths d1a are then made using the apparatus as aforedescribed. Since this is greater than the desired segment widths d1 (as defined by edges 130) the process is continued for a period of time felt to be sufficient to complete the etching process with such time being calculated from the measured widths d1 as first determined. If desired, a second, intermediate etching step may be monitored when the metal segments have widths d1b (defined by edges 130b), with the remaining etching time being again calculated based on the measured widths d1b. Finally, the desired segment widths d1 are achieved and can be readily checked while the photoresist Q remains in place on the undercut metal segments. Since the measurement determinations are unaffected by the photoresist Q and undistorted thereby, it will be appreciated that a significant increase in the accuracy of the measurements is obtained with the method and system of the present invention.

Figure 5:
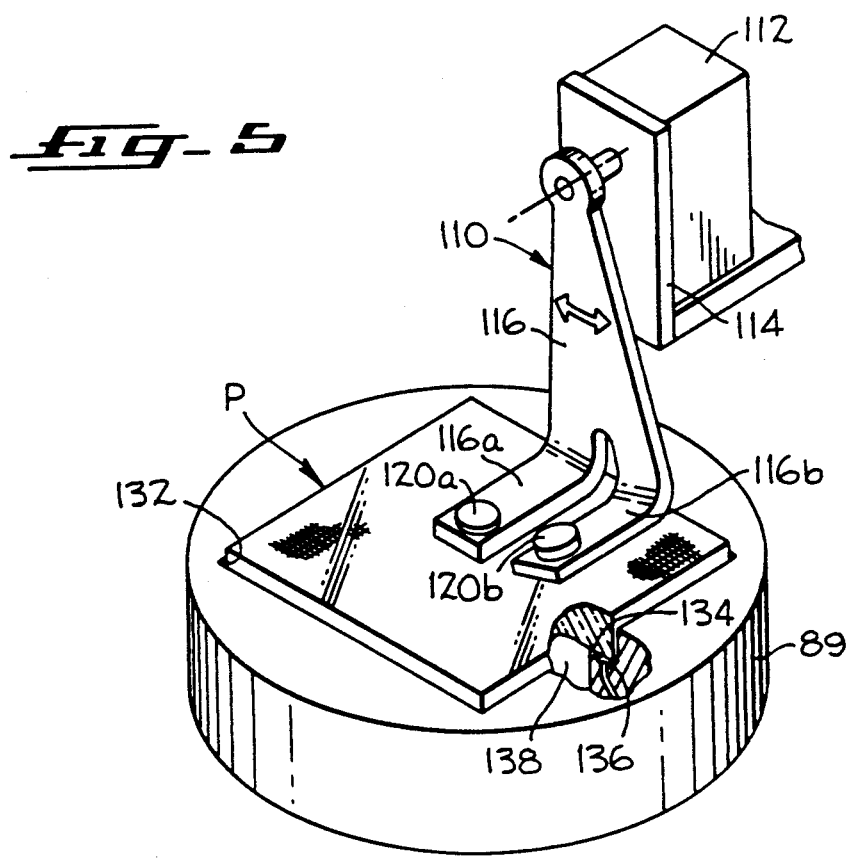
FIG. 5 is an isometric view of the substrate thickness compensator mechanism and the mask supporting chuck of the microscope of the present invention.

The substrate compensator mechanism 110 is shown in detail in FIG. 5. The stepper motor 112 is appropriately controlled to rotate its drive shaft and a disc carrier 116 pinned thereto through a selectable series of angular positions. In the embodiment shown the carrier 116 is fork-shaped with a pair of legs 116a and 116b projecting at right angles to the upper body of the carrier so that they can be individually positioned parallel to and closely overlying that area of the photomask P to be scanned. Each leg 116a, 116b has a recessed aperture into which is securely fitted the glass disc 120a, 120b that serves as the aforedescribed compensating glass plate to accommodate the particular mask substrate being inspected. With the embodiment shown, the carrier may be rotated through three different positions by the stepper motor: (1) both legs 116a, 116b pivoted away from the mask and out of the beam path; (2) leg 116a overlying the mask with disc 120a receiving the projected beam of the optical system (as shown in FIG. 5); and (3) leg 116b overlying the mask with disk 120b receiving the projected beam. The discs 120a, 120b are obviously of different thicknesses to accommodate different substrate thicknesses. With the system of the present invention, compensator discs of 0.1 inch and 0.16 inches have been chosen thereby providing for mask substrate thicknesses of 0.15 inches and 0.09 inches, respectively. Obviously, additional legs and supported discs 120 may be added to the carrier 116 if desired in order to increase the available options.

FIG. 5 also indicates the desired configuration of the chuck 89 for supporting the photomask P during the inspection process. It will be seen that the upper face of the chuck is provided with a recess 132 into which the mask is adapted to be placed and wherein it is arranged to be supported only along its peripheral edges by a narrow support ledge 134. Located at spaced positions about the support ledge are a plurality of vacuum slots 136 (one only shown in FIG. 5) which, when a vacuum source is applied thereto, serve to solidly fix the mask upon the chuck and prevent any relative movement thereof during the scanning operation. The large central recess 138 of the chuck underlies the entire patterned face of the photomask so as to prevent any contact with and possible damage by the hard surface of the chuck.

While a system based on visible wavelength confocal scanning microscopy has been disclosed, the present invention could have been incorporated in many other types of scanning or imaging optical microscopes designed for metrology applications operating at diverse visible or invisible wavelengths, such as: video microscopes including a video camera and optical microscope, Nipkow disc confocal microscopes, slit-scanning microscopes, beam scanning optical microscopes, object scanning microscopes and image shearing microscopes. For example, the present invention may be utilized with a non-scanning type of microscope wherein the entire area of the substrate of the photomask to be viewed is flooded with light and a video camera views such area and senses the reflected light intensity over a plurality of closely spaced points in a grid at the metal-substrate interface. As described previously, a compensating plate may be inserted between the objective lens of such a video cameramicroscope system and the photomask to compensate for varying substrate thicknesses in the manner previously pointed out.

In addition to its utility in inspecting photomasks during iterative etching processes, the method and apparatus of the present invention has utility in inspecting photomasks such as might be used in phase-shift lithography techniques wherein the mask varies in thickness and may be made of diverse patterned materials. By looking through the unpatterned side of the photomask the optical system as described may be focussed on a plane of interest which, for example, may be defined by the lowermost surfaces of the recesses on the patterned face of the mask. It will be appreciated that this plane of interest may be inspected with no distortion of the projected and reflected beams as would occur when imaging from the patterned side of the mask. Even multi-layered photomasks may be conveniently inspected with the system of the present invention by viewing into such masks through their unpatterned faces.

Although the best modes contemplated for carrying out the present invention have been herein shown and described, it will be apparent that other modifications and variations may be made without departing from what is regarded to be the subject matter of the invention.

What is claimed is:

1. A method for measuring the dimensions of the patterned features on a lithographic photomask comprising the steps of placing the photomask in a position to be viewed by an optical microscope using reflected light so that the unpatterned substrate side of the photomask is in a position facing the microscope, and obtaining reflectivity information at various points on the patterned layer of the photomask so as to provide information indicative of the dimensions of the features in the patterned layer of the photomask.

2. A method according to claim 1 wherein said optical microscope includes an optical system which has been optically corrected for imaging through transparent materials.

3. A method according to claim 2 including the step of relatively moving the photomask and the microscope to obtain a scan line across the mask along which said reflectivity information points are located.

4. A method according to claim 2 including the step of inserting a compensating transparent optical plate between the microscope and the photomask to compensate for a photomask having a substrate thickness less than the thickness compensated for by the optical system.

5. A system for measuring the dimensions of patterned features on a lithographic photomask comprising a light source, an optical microscope for directing light from said source to said photomask and for receiving reflected light from said patterned features in the photomask, means for mounting the photomask so that the patterned features lie in a plane approximately perpendicular the plane of the beam and so that the unpatterned side of the photomask faces the microscope, means for analyzing the reflected light from the photomask and for providing an output indicative of the dimensions of the patterned features on the photomask, and means for inserting optical plates of varying thicknesses between the photomask and the microscope to compensate for photomask substrate thicknesses of less than a predetermined maximum thickness.

6. A system according to claim 5 wherein said microscope includes an optical system which has been optically corrected for imaging through transparent materials.

7. A system according to claim 5 wherein the microscope includes a confocal optical system to limit the focal depth of the microscope.

8. A system according to claim 5 including means for relatively moving the microscope and the photomask to cause the microscope to scan along a line across the photomask.

9. A system according to claim 8 wherein said analyzing means provides output information of the reflectivity at a plurality of closely spaced points along said scan line.

10. A system according to claim 5 wherein said plate inserting means comprises a carrier having an optical plate positioned thereon, and means for selectively moving the carrier between positions wherein the plate intercepts the light from the microscope and wherein the plate is outside of the light from the microscope.

11. A system according to claim 10 wherein said carrier is mounted for pivotable movement about an axis parallel to the plane of said photomask and wherein said plate is carried on a leg extending generally at a right angle to the remainder of said carrier.

12. A system according to claim 10 wherein said carrier has a plurality of optical plates positioned in spaced positions thereon and wherein said moving means is arranged to selectively move each of said plates to said position intercepting the light from said microscope.

13. A system for measuring the dimensions of patterned features on a lithographic photomask comprising a light source, an optical microscope for directing light from said source to said photomak and for receiving reflected light from said patterned features in the photomask, means for mounting the photomask so that the patterned features lie in a plane approximately perpendicular the plane of the beam and so that the unpatterned side of the photomask faces the microscope, and means for analyzing the reflected light from the photomask and for providing an output indicative of the dimensions of the patterned features on the photomask, said microscope including an optical system which has been optically corrected for imaging through transparent materials.

14. A method for measuring the dimensions of the patterned features on a lithographic photomask in an iterative etching process comprising the steps of etching the exposed metal from the photomask so as to provide the patterned features therein, placing the etched photomask in a position to be viewed by an optical microscope using reflected light so that the unpatterned substrate side of the photomask is in a position facing the microscope, obtaining reflectivity information at various points on the patterned layer of the photomask so as to provide information indicative of the dimensions of the features in the patterned layer of the photomask and thereby determining the degree of the etch necessary to complete the etching process, and further etching the exposed metal from the photomask to provide the patterned features with greater accuracy.

15. A method according to claim 14 including the step of inserting a compensating transparent optical plate between the microscope and the photomask to compensate for a photomask having a substrate thickness less than the thickness compensated for by the optical system.

16. A method according to claim 14 including the step of relatively moving the photomask and the microscope to obtain a scan line across the mask along which said reflectivity information points are located.

17. A method according to claim 16 wherein the step of obtaining reflectivity information includes the steps of determining the location of a first edge in the patterned layer, determining the location of a second edge in the patterned layer, and recording the distance of relative movement between the edge determinations as a measurement of the distance between the first and second edges.

18. A method for measuring the dimensions of the patterned features on a lithographic photomask comprising the steps of placing the photomask in a position to be viewed by an optical microscope using reflected light so that the unpatterned substrate side of the photomask is in a position facing the microscope, locating a first edge of the patterned layer, relatively moving the photomask and the microscope through a scan distance until a second edge of the patterned layer is detected, and determining the distance of relative movement as a measurement of the distance between said first and second edges of the patterned layer.

* * * * *